United States Patent [19]

Andresen et al.

[11] Patent Number: 4,612,499

[45] Date of Patent: Sep. 16, 1986

[54] TEST INPUT DEMULTIPLEXING CIRCUIT

[75] Inventors: Bernhard H. Andresen; Stanley C. Keeney, both of Dallas, Tex.

[73] Assignee: Texas Instruments Incorporated, Dallas, Tex.

[21] Appl. No.: 549,121

[22] Filed: Nov. 7, 1983

[51] Int. Cl.$^4$ ............................................. G01R 31/28
[52] U.S. Cl. .................................. 324/73 R; 307/360; 371/15
[58] Field of Search ............. 324/73 R, 158 T, 158 R; 307/350, 354, 355, 356, 357, 358, 360, 361, 362, 363, 364, 451; 371/15

[56] References Cited

U.S. PATENT DOCUMENTS

| 3,117,238 | 1/1964 | McNair, Jr. ........................ 307/360 |
| 4,103,190 | 7/1978 | Beutler ............................... 307/358 |
| 4,274,014 | 6/1981 | Schade, Jr. ......................... 307/451 |
| 4,336,495 | 6/1982 | Hapke ............................. 324/73 R X |
| 4,339,710 | 7/1982 | Hapke ............................... 324/73 R |
| 4,398,146 | 8/1983 | Draheim et al. ................... 324/73 R |

FOREIGN PATENT DOCUMENTS

| 55-78263 | 6/1980 | Japan ................................. 324/73 R |
| 56-112666 | 9/1981 | Japan ................................. 324/73 R |
| 57-133656 | 8/1982 | Japan ................................. 324/73 R |

Primary Examiner—Stewart J. Levy
Assistant Examiner—Stephen M. Baker
Attorney, Agent, or Firm—Richard A. Bachand; N. Rhys Merrett; Melvin Sharp

[57] ABSTRACT

A test signal, used to initialize an integrated circuit chip for testing, is multiplexed with a data input line of the chip. The test signal circuitry is inactivated during normal operation of the chip. The test circuitry is activated only when a special input signal, which is a voltage at some midpoint between logic states, is applied to the data input.

6 Claims, 1 Drawing Figure

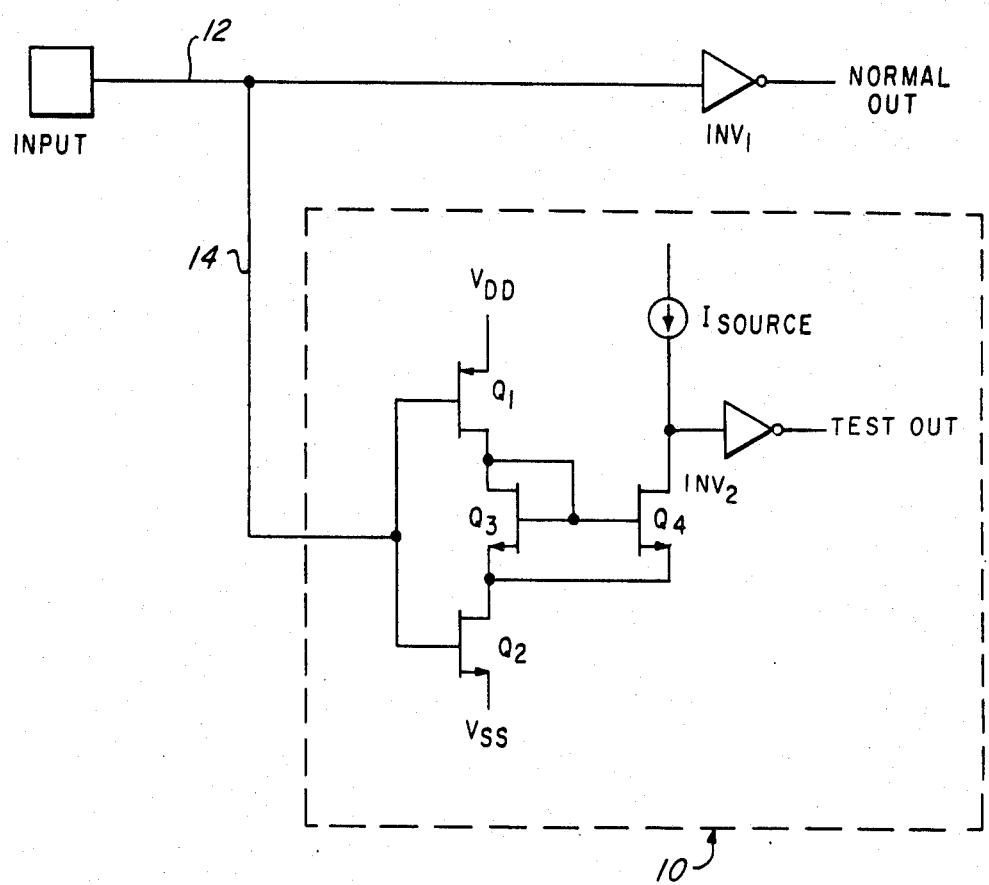

TEST INPUT DEMULTIPLEXING CIRCUIT

BACKGROUND AND SUMMARY OF THE INVENTION

This invention relates generally to demultiplexing of signals on a single data line and more specifically to using a single input line to an integrated circuit chip for both data and test input signals.

Complex integrated circuitry often requires that provision be made for inputting a test signal to the chip. This test signal can be used to initialize the chip to a predetermined state for testing at any stage from fabrication through assembly of the larger device or system into which the chip is incorporated. Additionally, testing can be done in the field in order to troubleshoot nonoperational machinery. One or more test inputs are typically used to set the integrated circuit chip into one or more preselected states to facilitate the testing procedure.

Prior to the present invention, it has been necessary to dedicate one or more input pins to the chip to receive the test signal. Pins available to be used as input and output lines to a complex integrated circuit chip are generally at a premium. The test input pins are generally seldom used, and are often never used once the chip has been finally incorporated into a complete product. It would be desirable to include the test input function on a pin which also doubles as a regularly used input to the chip.

Several design constraints have prevented the successful combination of data and test input lines prior to the present invention. The overriding constraint is that the test input must not be affected by the normal operation of applying data to the input line. In other words, a test signal must not be generated unless such is specifically intended. If any unwanted test signal is generated during normal operation of the chip, the chip function can generally be considered to have failed completely.

It is also important, especially with the use of CMOS devices, that the input signal used to generate the test condition is compatible with standard input devices. These input devices prevent unwanted high or low value signals from entering, and thus perhaps harming, the circuitry of the chip. For example, if high voltage signals exceeding the supply voltages were used on an input line to indicate a test signal, the chip as a whole would be susceptible to latch up and other damage.

Space is at a premium in many chip designs, so it is important that a test circuit which accomplishes the above function has a minimum number of elements. A circuit which is simple in terms of number of active devices is also easily incorporated onto many different chips. Another desirable feature of such a test circuit would be low power consumption.

It is therefore an object of the present invention to provide on-chip circuitry, for generating a test signal, which is connected to an input pin which is used for data input in normal operation. It is a further object of the present invention that such test signal generation circuitry will not generate an unwanted test signal. It is a further object of the present invention that such test signal generation circuitry be compatible with the voltages already used on the chip in order to minimize potential damage. It is yet another object of the present invention that such test signal generation circuitry be simple, easily adapted to a wide number of chip designs, and use little or no power when the chip is in normal operation.

Therefore, according to the present invention, test signal generation circuitry is coupled to a data input line of an integrated circuit chip. The input line is coupled to gates of two complementary field effect devices which have threshold voltages less than one half of the power supply voltage. The field effect devices are coupled across the power supply so that current can flow only if both devices are on. Means are provided for detecting current flow through the devices, and for generating a test signal when current is flowing. The test signal is held off when no current flows through the complementary devices.

In order to generate a test signal, a voltage that exceeds $V_{ss}$ by more than the N-channel threshold voltage but is more negative than a P-channel threshold below $V_{dd}$ is applied to the input pin. This causes the complementary field effect devices to both turn on, allowing current to flow. This current flow is sensed by the current sensor, which generates a test signal. When the input signal is either high or low, one of the complementary field effect devices is off, so that no current flows. Thus, the test signal is generated only when a middle range voltage signal, which is not encountered as data during normal operation, is applied to the input.

The novel features which characterize the present invention are defined by the appended claims. The foregoing and other objects and advantages of the invention will hereinafter appear, and for purposes of illustration, but not limitation, a preferred embodiment is shown in the drawing.

BRIEF DESCRIPTION OF THE DRAWING

The FIGURE is a schematic diagram of a circuit for demultiplexing data and test signals on a single input line according to the present invention.

DESCRIPTION OF THE PREFERRED EMBODIMENT

The embodiment of the present invention shown in the drawing and described below is intended to be used with an input line to an integrated circuit chip which has an unchanging value during normal chip operation. Use of the invention with a data input line having changing values will be described below. INPUT is a data line onto the integrated circuit chip, and incorporates suitable protective devices as known in the art. The input data signal is buffered in $INV_1$ giving the signal NORMAL OUT under the usual operating conditions. As used in the FIGURE, INPUT will be tied to a logic 1 or 0 at the time of installation in the end product. Thus, the signal to INPUT is fixed during normal operation of the device.

In order to have the capability to generate a test input signal without using a separate test input to the chip, a test signal demultiplexer 10 is coupled to input line 12. This demultiplexer circuit generates a TEST OUT signal of logical 0 during normal operation, and a logical 1 when a special test signal is needed. This test signal can be used to set the logic on the remainder of the chip to a predetermined value, or as otherwise desired by the designer. In the preferred embodiment, the TEST OUT signal will be generated only at the factory in order to test for proper operation of the chip; the TEST OUT signal will remain a logical 0 at all times for the end user.

The input to the test signal generation circuitry 10 is coupled to the input line 12 internally of the chip. $V_{dd}$ and $V_{ss}$ are preferably +5 and 0 volts respectively. $Q_1$ and $Q_2$ are P channel and N channel transistors respectively, and the gates of $Q_1$ and $Q_2$ are both tied to test generation circuitry input line 14. This arrangement is similar to a standard CMOS inverter, wherein exactly one of $Q_1$ and $Q_2$ is on whenever the input signal is either a logical 1 ($V_{dd}$) or a logical 0 ($V_{ss}$). Thus, with an input of 0 or 5 volts, one of $Q_1$ or $Q_2$ is off, and no current flows from $V_{dd}$ to $V_{ss}$ within the test signal demultiplexer 10.

Threshold voltages for $Q_1$ and $Q_2$ are less than one half the supply voltage, and typically are slightly less than one volt. Thus, if the input signal to line 12 is in the range of 1 to 4 volts both $Q_1$ and $Q_2$ will be on. The current through $Q_1$ and $Q_2$ passes through $Q_3$, and is mirrored in $Q_4$ because the gates of $Q_3$ and $Q_4$ are coupled together. If $Q_4$ and $Q_2$ are large enough that their drain current exceeds that which can be supplied by $I_{source}$, the voltage at the input to $INV_2$ will go low (logical 0), causing TEST OUT to go high (logical 1). Thus, by applying an intermediate level signal to INPUT, TEST OUT will become a logical 1 and can be used to initialize the remaining chip circuitry as desired.

It can be easily seen that TEST OUT will remain low whenever INPUT is either a logical 1 or logical 0. When INPUT is low, $Q_2$ is off. Therefore, no current can flow through $Q_4$ and the voltage at the input to $INV_2$ is driven high by $I_{source}$. Thus, TEST OUT is low. When INPUT is high, $Q_2$ is on but $Q_1$ is off. Since no current flows through the $Q_1$-$Q_3$-$Q_2$ path, no current can be mirrored in $Q_4$ and $I_{source}$ drives the input to $INV_2$ high, driving TEST OUT low.

Thus, the circuit 10 shown in the drawing gives a TEST OUT signal of 0 whenever the input is either a logical 0 or a logical 1, and a TEST OUT of 1 when the input is specially driven to an intermediate voltage level in the range of 1 to 4 volts. Of course, changing the values of $V_{dd}$ and $V_{ss}$ will change the voltage range applied to INPUT in order to enable the TEST OUT signal.

The test signal generation circuitry 10 can be made less sensitive to small voltage fluctuations in the input data by increasing the gate-source voltages of $Q_1$ and $Q_2$, for example to 1.5 volts to be able to overcome $I_{source}$. This can be done by reducing the width to length ratios of these devices. $Q_1$ and $Q_2$ will operate as above when INPUT is from 1.5 to 3.5 volts, but will remain off for small fluctuations. For example, a logical 1 applied to INPUT which happens to only be 4.0 volts will not endanger chip functions by turning $Q_1$ on.

It may be important that the value of NORMAL OUT be known when TEST OUT is high. $INV_1$ is preferably a standard CMOS inverter with a threshold of ($V_{dd}+V_{ss}$)/2. By adjusting the input level to be below or above the INV1 threshold but still within the range of activation of the test input, NORMAL OUT can be fixed at either logical 1 or logical 0. For example, if it desired that NORMAL OUT be low when TEST OUT is high, the input could be set to 3.5 volts which is within the 1.0–4.0 volt activation range of TEST OUT and sufficiently above the 2.5 volt threshold of INV1 to appear as a logic '1' input. In the same manner, the input could be set to 1.5 volts if it is desired that NORMAL OUT be high when TEST OUT is high. If INV1 is a TTL compatible threshold inverter, any level between 2 and 4 volts will activate the TEST OUT with NOR-MAL OUT being logical 0. In this instance, NORMAL OUT cannot go to logical 1 in the test mode unless gated logically by TEST OUT. In some cases, the value of NORMAL OUT is unimportant when TEST OUT is high because TEST OUT will be used only to set various devices on the chip to preselected values. NORMAL OUT would not necessarily be used until after TEST OUT had been returned to 0 by changing INPUT to either a logical 1 or 0.

Multiplexing of a test signal to an already used input line has a number of advantages. Most important is that no extra pin connections are required for a test signal input, simplifying fabrication. The input signal is always between $V_{dd}$ and $V_{ss}$, which allows standard input protection devices to be used and minimizes the potential of latch up. This generally provides a cheaper and simpler device than, for example, driving the test signal demultiplexing circuitry with an input value which is higher than $V_{dd}$ or lower than $V_{ss}$.

An important advantage of the circuit described above is that virtually no power is consumed by the test signal demultiplexer 10 when the chip is operating in the normal mode. $I_{source}$ can be made from a P channel FET by tying the source to $V_{dd}$, the drain to the drain of $Q_4$, and the gate to ground. When $I_{source}$ is so designed, no current flows through $I_{source}$ unless a path to ground is available through $Q_4$. As described above, no such path is available when the chip is in the normal operating mode. As also described above, no current flows through the $Q_1$-$Q_3$-$Q_2$ current path in the normal mode. Thus, power is required for test signal demultiplexer 10 only when the chip is in the test mode, defined by applying an intermediate voltage level to INPUT.

The test signal demultiplexing circuitry 10 has been described above as used with an input which is normally tied to a logical 1 or 0, and which does not change during operation of the device. However, not all chips will have a fixed value input line which is suitable for use in this manner, and it may be desirable to multiplex the test signal with a variable data input line. The circuit described above is not generally suitable for use with an input line having changing values. Spurious TEST OUT signals can be generated when the input line is changing between logical states. Generally, however, this can be easily overcome. For example, if the circuitry which generates the input signal and the chip containing the test signal demultiplexing circuitry 10 are driven by a common clock signal, a D flip-flop can be inserted in the TEST OUT line after $INV_2$ and driven by the clock signal. This will prevent spurious TEST OUT signals, which are generated only during a transition of the input signal, from reaching the remainder of the chip. Various other types of pulse width discriminating circuits can be used to filter out these spurious signals during input transitions. Other methods will become apparent to those skilled in the art.

Although a preferred embodiment has been described in detail, it is understood that various substitutions, additions and modifications may become apparent to those skilled in the art. These changes may be made without departing from the spirit and scope of the invention, which is defined by the appended claims.

What is claimed is:

1. A circuit for demultiplexing at least two information signals, comprising:
   an input line;
   two complementary field effect devices having gates coupled to said input line, wherein each of said field effect devices has a threshold voltage less than one-half of an available power supply voltage, and wherein said field effect devices are coupled together in series to create a current path across the power supply only when both of said field effect devices are on;

means coupled to said field effect devices for sensing the passage of current through the current path; and a switch coupled to said sensing means, wherein said switch has a first state when said sensing means detects current flow and a second state when no current flow is detected.

2. The circuit of claim 1, wherein said sensing means comprises:

a third field effect device coupled to said complementary field effect devices, wherein current flowing through the path passes through said third field effect device, and wherein a gate input of said third field effect device is coupled to the current path between said complementary field effect device to turn said third field effect device on when current flows through the current path; and a fourth field effect device having a gate input, a first output coupled to the current path between said complementary field effect devices, and a second output coupled to said switch, wherein said fourth field effect device is on only when current flows through the current path.

3. The circuit of claim 1, further comprising timing logic means coupled to the output of said switch.

4. The circuit of claim 3, wherein said timing logic means comprises a flip-flop.

5. An electrical circuit for detecting test signals on a data line, comprising:

complementary transistors having inputs coupled to the data line;

means for detecting current flow through both of said complementary transistors; and switch means coupled to said detecting means for generating a test signal when current is flowing through both of said complementary transistors.

6. An electronic system having a test input multiplexed with a data input according to claim 5, further comprising:

at least one active electronic device coupled to the data line, wherein said active electronic device, said complementary transistors, said detecting means and said switch means are all fabricated on a single integrated circuit chip.

* * * * *